(12) United States Patent
Gapihan et al.

(10) Patent No.: US 8,411,500 B2
(45) Date of Patent: Apr. 2, 2013

(54) MAGNETIC DEVICE WITH OPTIMIZED HEAT CONFINEMENT

(75) Inventors: Erwan Gapihan, Bouchemaine (FR); Kenneth Mackay, Le Sappey en Chartreuse (FR); Jason Reid, San Jose, CA (US)

(73) Assignee: Crocus Technology SA, Grenoble Cedex (FR)

( * ) Notice: Subject to any disclaimer, the term of this patent is extended or adjusted under 35 U.S.C. 154(b) by 154 days.

(21) Appl. No.: 13/154,912

(22) Filed: Jun. 7, 2011

(65) Prior Publication Data

US 2012/0008383 A1  Jan. 12, 2012

(30) Foreign Application Priority Data

Jul. 7, 2010  (EP) .................................. 10290375

(51) Int. Cl.
*G11C 11/15* (2006.01)
*G11C 11/14* (2006.01)
(52) U.S. Cl. .................. 365/173; 365/158; 365/171
(58) Field of Classification Search .................. 365/158, 365/171, 173
See application file for complete search history.

(56) References Cited

U.S. PATENT DOCUMENTS

| 6,950,335 B2 | 9/2005 | Dieny et al. | |
| 2010/0208516 A1* | 8/2010 | Javerliac et al. | 365/171 |

FOREIGN PATENT DOCUMENTS

| EP | 1671330 | | 6/2006 |
| FR | 2860910 | A1 | 4/2005 |
| WO | 0079540 | A1 | 12/2000 |

OTHER PUBLICATIONS

European Search Report for EP10290375 dated Jan. 19, 2011.
I.L. Prejbeanu, M. Kerekes, R. C. Sousa, H. Sibuet, O. Redon, B. Dieny, and J.P. Nozieres: "Thermally Assisted MRAM"; Journal of Physics: Condensed Matter, Institute of Physics Publishing, Bristol, GB, vol. 19, No. 16, Apr. 23, 2007, p. 165218, XP020116868; ISSN: 0953-8984, DOI: DOI:10 1088/0953-8984/19/16/165218 *paragraphs [05.1], [00 6], [00 7]; figures 22, 23.

* cited by examiner

*Primary Examiner* — Ly D Pham
(74) *Attorney, Agent, or Firm* — Pearne & Gordon LLP

(57) ABSTRACT

The present disclosure concerns a magnetic element to be written using a thermally-assisted switching write operation comprising a magnetic tunnel junction formed from a tunnel barrier being disposed between first and second magnetic layers, said second magnetic layer having a second magnetization which direction can be adjusted during a write operation when the magnetic tunnel junction is heated at a high threshold temperature; an upper current line connected at the upper end of the magnetic tunnel junction; and a strap portion extending laterally and connected to the bottom end of the magnetic tunnel junction; the magnetic device further comprising a bottom thermal insulating layer extending substantially parallel to the strap portion and arranged such that the strap portion is between the magnetic tunnel junction and the bottom thermal insulating layer. The magnetic element allows for reducing heat losses during the write operation and has reduced power consumption.

14 Claims, 7 Drawing Sheets

MAGNETIC DEVICE WITH OPTIMIZED HEAT CONFINEMENT

FIELD

The present disclosure concerns a magnetic element comprising a magnetic tunnel junction that can be written by using a thermally assisted switching write operation and a magnetic memory device comprising a plurality of the magnetic element.

BACKGROUND

A magnetic element adapted to perform a thermally-assisted switching (TAS) read and write operation and comprising a magnetic tunnel junction is described in U.S. Pat. No. 6,950,335. As shown in FIG. 1, the magnetic element 1 comprises a magnetic tunnel junction 2 formed from a tunnel barrier 22 being disposed between a first magnetic layer, or reference layer 21, and a second magnetic layer, or storage layer 23. The magnetic element 1 further comprises an upper current line 4 connected at the upper end of the magnetic tunnel junction 2, and a strap portion 7 extending laterally and substantially parallel to the first and second magnetic layers 21, 23 and connecting the bottom end of the magnetic tunnel junction 2 to a select transistor 3. The configuration strap portion 7 is advantageous for disposing a bottom current line 5 which uses will be discussed below.

The reference layer 21 can be formed from a Fe, Co or Ni based alloy and have a first magnetization that having a fixed magnetization direction. The first magnetization can be fixed in any conventional manner, such as by using a high coercivity (or large switching magnetic field) material. For example, the direction of the first magnetization can be fixed by being exchange-coupled to an antiferromagnetic reference layer (not shown) pinning the first magnetization at a low threshold temperature, below the reference blocking temperature $T_{BR}$ of the antiferromagnetic reference layer.

Preferably, the tunnel barrier 22 is a thin layer, typically in the nanometer range and is formed, for example, from any suitable insulating material, such as alumina or magnesium oxide. The tunnel barrier 22 has typically a resistance-area product smaller than 50 $\Omega \cdot m^2$.

The storage layer 23 can have a second magnetization which direction can be freely adjusted when the magnetic tunnel junction 2 is heated at a high threshold temperature. The storage layer 23 can be a layer of ferromagnetic material typically including Fe, Co, Ni or their alloys. The storage layer 23 can be exchange-coupled with an adjacent antiferromagnetic storage layer (not shown) pinning the storage layer 23 at a temperature below a storage blocking temperature $T_{BS}$ of the antiferromagnetic storage layer, where $T_{BS}$ is preferably smaller than the storage blocking temperature $T_{BR}$. The antiferromagnetic storage layer can be made of an alloy of Fe and Mn, such as FeMn, or Ir and Mn, for example, an alloy containing 20% of Ir and 80% of Mn. The storage blocking temperature $T_{BS}$ can be typically comprised between 150° C. and 250°. During the TAS write operation, the magnetic tunnel junction 2 is heated at the high threshold temperature, above $T_{BS}$ but below $T_{BR}$, by applying a heating current 31 to the magnetic tunnel junction 2. The heating current 31 can be applied via the current line 4, when the select transistor 3 is in the passing mode. Once the magnetic tunnel junction 2 is heated at the high threshold temperature, the direction of the second magnetization can be adjusted by passing a spin polarized electric current or a current induced magnetic switching (CIMS) in the magnetic tunnel junction 2, or by using an external magnetic field 52 as shown in FIG. 1. In the latter case, the external magnetic field 52 can be generated by a passing a field current 51 in the bottom current line 5. The position of the bottom current line 5 in the vicinity of the storage layer 23 allows for minimizing the field current 51 used. During writing, the second magnetization can be oriented such as to be substantially parallel or antiparallel (as in the example of FIG. 1) with the first magnetization direction. The second magnetization is then frozen in its switched direction by inhibiting the heating current 31, cooling the magnetic tunnel junction 2 at a low threshold temperature, below $T_{BS}$.

During the read operation, the resistance of the magnetic tunnel junction 2 can be measured by passing a sense current (not shown) through it. The measured resistance varies depending on the relative directions of the first and second magnetizations. A high resistance is measured when the first magnetization is oriented substantially antiparallel with the second magnetization and a small resistance is measure when the first and second magnetizations are oriented substantially parallel.

Passing the heating current 31 for heating the magnetic tunnel junction 20 to the predetermined high temperature threshold, requires applying a voltage $V_{heat}$, having a possibly high value, between the reference and storage layers 1, 4.

In FIG. 2, the potential energy E is plotted against a distance X along the magnetic tunnel junction 2, representing the potential energy function 8 of the electrons in the magnetic tunnel junction 2 subjected to a potential $V_{heat}$, generated when the heating current 31 is passed in the magnetic tunnel junction 2. In FIG. 2, the reference and storage layers 21, 23 are located on each side of the tunnel barrier 22, placed at X0. For negative values of the heating current 31, the reference and storage layers 21, 23 behave like an electron-emitting layer having an upper Fermi level Efs, and an electron-receiving layer having a lower Fermi level Efi, respectively. The difference of the Fermi levels is proportional to the potential difference: Efs−Efi=eV, e being the elementary charge of the electron. As illustrated by the arrow 9, an electron emitted by the emitting layer passes through the tunnel barrier 22, by tunnel effect, without dissipating energy. When inelastic relaxation of the electron from a higher energy Efs to a lower energy Efi takes place, the electron dissipates the energy eV in the electron-receiving layer, for example by creation of phonons 10 and/or magnons 11, which increases the temperature of the electron-receiving layer. Inelastic relaxation takes place over a characteristic length, or inelastic mean free path, $\lambda_{in}$, which length is typically about a few nanometers in the magnetic materials usually used in typical magnetic tunnel junctions. Heat production by the electrons passing through the tunnel barrier 22, or tunnel current (not shown), is thus maximal in a zone with a thickness of a few nanometers, located in the receiving layer and adjacent to the tunnel barrier 22. Since the potential $V_{heat}$ used for heating the magnetic tunnel junction 2 at the high temperature threshold can be high, such heat production can damage the magnetic tunnel junction 2.

It can be advantageous to thermally insulate the magnetic tunnel junction 2 such that during the TAS write operation, the magnetic tunnel junction 2 is heated efficiently with a reduced heating current 31, thus minimizing the electric power necessary for performing the write operation.

FIG. 3 illustrates the magnetic element 1 according to European Patent Application No. 1,671,330, where the magnetic tunnel junction 2 further comprises an upper thermal barrier 14 placed between the current line 4 and the reference layer 21, and a bottom thermal barrier 15, between the storage layer 23 and the strap portion 7. In FIG. 3, a bottom electrode 16 is represented, connected to the strap portion 7 through a bottom via 17. The select transistor 3, not represented in FIG. 3, can be connected to the bottom electrode 16 or directly to the bottom via 17. During the TAS write operation, the upper and bottom thermal barrier 14, 15 advantageously reduce heat losses at both upper and bottom ends of the magnetic tunnel junction 2, when the heating current 31 is passed. Consequently, a more efficient heating of the magnetic tunnel junction 20 is achieved and the heating current 31, or potential $V_{heat}$, needed for heating the magnetic tunnel junction 20 can be lowered.

Since the thermal barriers 14, 15 are connected in series with the tunnel barrier 22, their electrical conductivity must be high enough compared to that of the tunnel barrier 22 to ensure that the electrical current flows uniquely through the magnetic tunnel junction 2. Preferably, the electrical conductivity of the thermal barriers 14, 15 is higher by a factor ten compared with that of the tunnel barrier 22. This limits the possibility of using material with very low thermal conductivity for the thermal barriers 14, 15. Typically, such thermal barriers are made from an alloy containing Bismuth (Bi) and Tellurium (Te), such as BiTe, which exhibits an electric conductivity of about 1.75 mΩ-cm and a thermal conductivity of about 1.5 W m$^{-1}$° C.$^{-1}$.

SUMMARY

The present disclosure concerns a magnetic element which overcomes at least some limitations of the prior art.

According to the embodiments, a magnetic element to be written using a thermally-assisted switching write operation can comprise a magnetic tunnel junction formed from a tunnel barrier being disposed between first and second magnetic layers, said second magnetic layer having a second magnetization which direction can be adjusted during a write operation when the magnetic tunnel junction is heated at a high threshold temperature; an upper current line connected at the upper end of the magnetic tunnel junction; and a strap portion extending laterally and connected to the bottom end of the magnetic tunnel junction; wherein the magnetic device can further comprise a bottom thermal insulating layer extending substantially parallel to the strap portion and arranged such that the strap portion is between the magnetic tunnel junction and the bottom thermal insulating layer, for lowering heat losses in the magnetic tunnel junction during the write operation as compared to with the magnetic tunnel junction without the bottom thermal insulating layer.

In an embodiment, the magnetic element can further comprise an upper thermal insulating layer arranged at the upper end of the magnetic tunnel junction, between the upper current line and the magnetic tunnel junction.

In another embodiment, the magnetic element can further comprise a lateral thermal insulating layer, laterally embedding at least a portion of the magnetic tunnel junction.

In yet another embodiment, said at least a portion of the magnetic tunnel junction can comprise the bottom magnetic layer, the upper magnetic layer, the tunnel barrier, or a combination of any of them.

In yet another embodiment, said at least a portion of the magnetic tunnel junction can comprise the whole magnetic tunnel junction.

In yet another embodiment, the thermal insulating layer can have a thermal conductivity lower than 1.0 Wm$^{-1}$° C.$^{-1}$.

In yet another embodiment, the thermal insulating layer can be made from a low-K material.

In yet another embodiment, the magnetic tunnel junction can further comprise an upper thermal barrier between the upper current line and the magnetic tunnel junction, and a bottom thermal barrier between the magnetic tunnel junction and the strap portion.

In yet another embodiment, the longitudinal thermal barriers can have an electrical resistance lower than the electrical resistance of the tunnel barrier by a factor of at least ten.

In yet another embodiment, the magnetic tunnel junction can comprise an electrically insulating liner layer embedding the magnetic tunnel junction.

In yet another embodiment, the magnetic element can further comprise a select transistor connected at the lower end of the magnetic tunnel junction via the strap portion and that can be activated to apply a heating current to said magnetic tunnel junction via the upper current line, for heating magnetic tunnel junction at the high threshold temperature.

The present disclosure also pertains to a magnetic memory device comprising a plurality of the magnetic element where one or a plurality of the current line being coupled to said plurality of the magnetic element via their magnetic tunnel junction, and comprising one or a plurality of control current lines coupled to the magnetic elements via their select transistor.

The magnetic element disclosed herein allows for reducing heat losses more effectively compared to conventional magnetic elements using a thermal barrier between the upper current line and the magnetic tunnel junction and/or between the strap portion and the magnetic tunnel junction. The thermal insulating layer can be easily integrated into the manufacturing process of the magnetic element, without increasing the complexity of the manufacturing process. The magnetic element and memory device of the invention can then be used with a smaller heating current than the one used in conventional magnetic element and memory device, thus reducing power consumption and improving the endurance of the magnetic element.

BRIEF DESCRIPTION OF THE DRAWINGS

The disclosure will be better understood with the aid of the description of an embodiment given by way of example and illustrated by the figures, in which.

DETAILED DESCRIPTION OF POSSIBLE EMBODIMENTS

Figure 1:
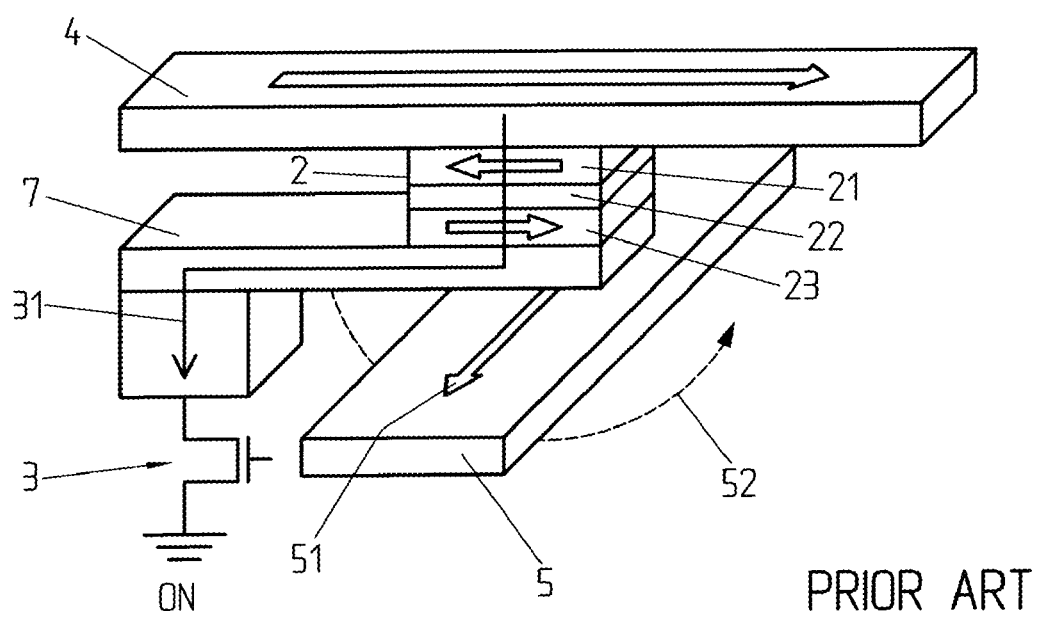
FIG. 1 shows a conventional magnetic element comprising a magnetic tunnel junction and adapted for performing a thermally-assisted switching write operation.
Figure 2:
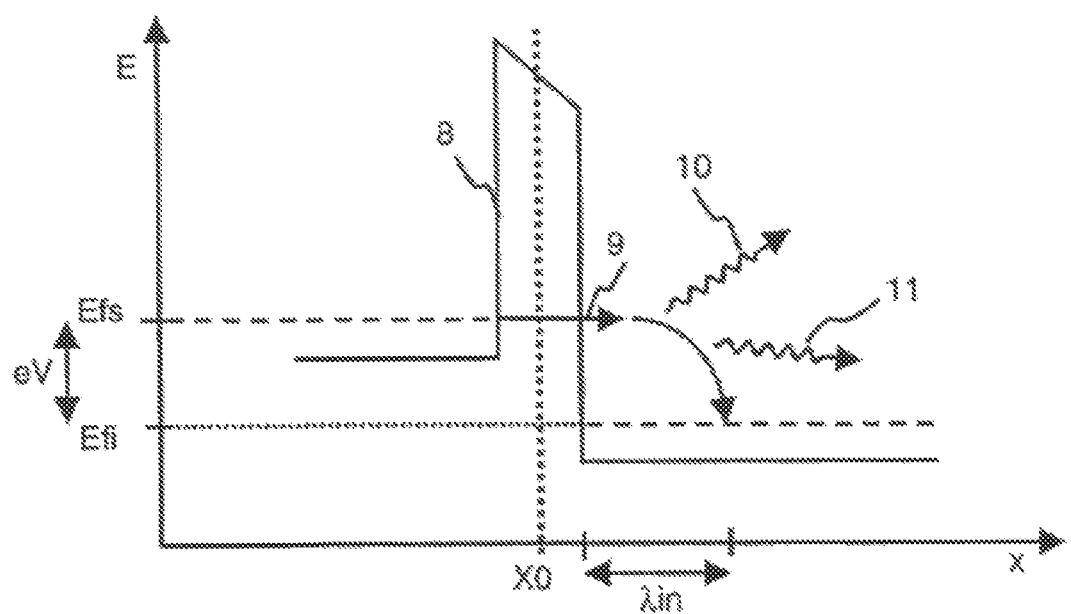
FIG. 2 represents the potential energy function of the electrons in the magnetic tunnel junction of FIG. 1 subjected to a potential.
Figure 3:
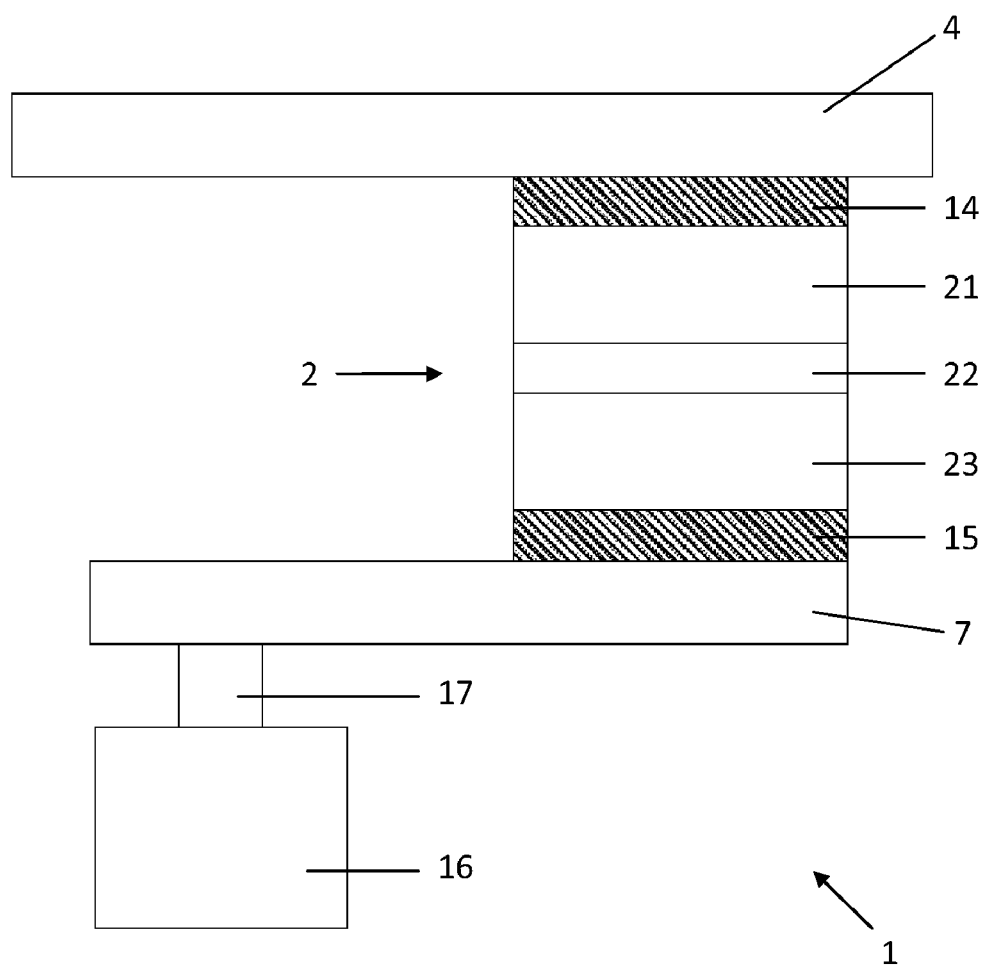
FIG. 3 illustrates another conventional magnetic element where the magnetic tunnel junction contains a first and a second longitudinal thermal barrier.
Figure 4:
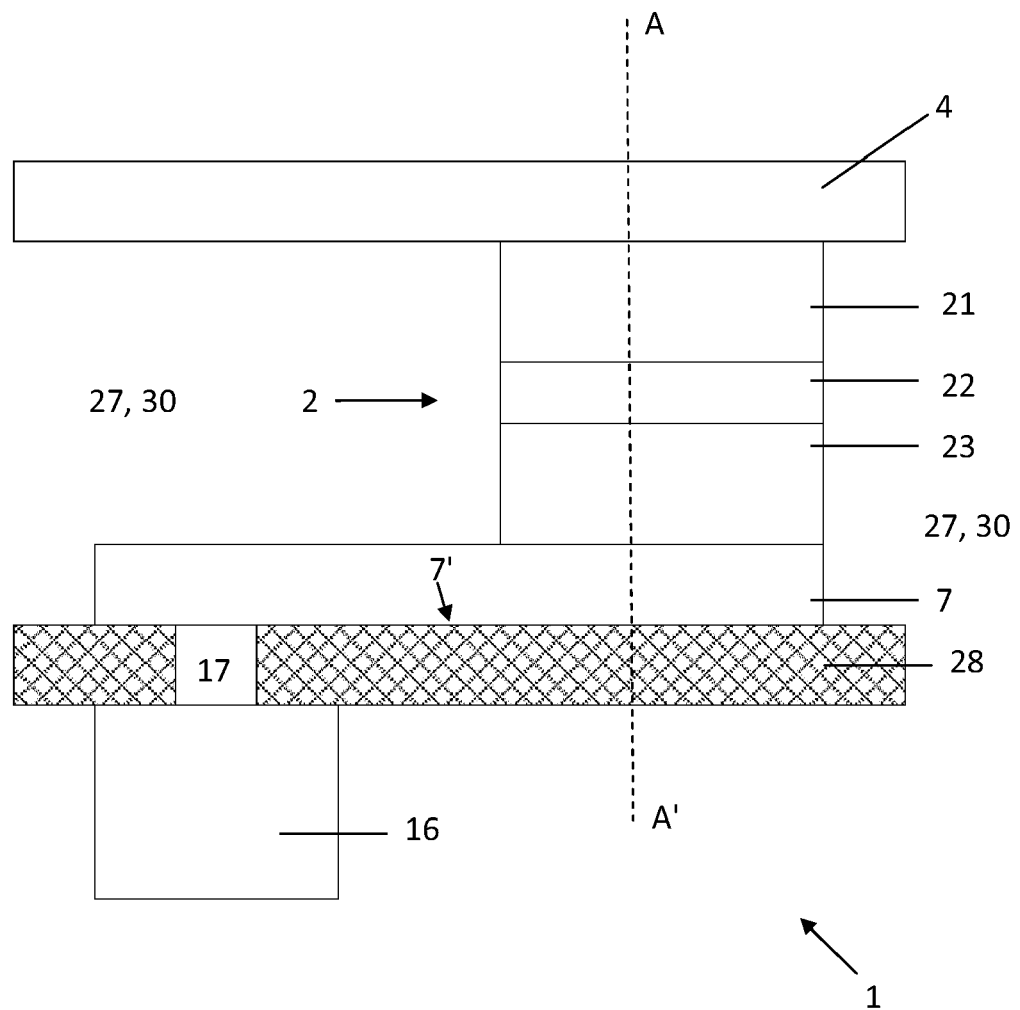
FIG. 4 represents the magnetic element, according to an embodiment.

A magnetic element 1 is represented in FIG. 4 according to an embodiment. As described above, the magnetic element 1 comprises a magnetic tunnel junction 2 formed from a tunnel barrier 22 being disposed between first and second magnetic layers 21, 23. The second magnetic layer 23 has a second magnetization which direction can be adjusted during a write operation when the magnetic tunnel junction 2 is heated at a high threshold temperature. The magnetic element 1 also comprises an upper current line 4 connected at the upper end of the magnetic tunnel junction 2, and a metallic strap portion 7 extending laterally substantially parallel to the first and second magnetic layers 21, 23 and connecting the bottom end of the magnetic tunnel junction 2 to a bottom electrode 16 though a bottom via 17. In the embodiment of FIG. 4, the memory cell 1 further comprises a bottom thermal insulating layer 28 extending below the strap portion 7 and substantially parallel to it. In this configuration, the strap portion 7 is between the magnetic tunnel junction 2 and the bottom thermal insulating layer 28, the latter contacting the strap portion 7 along its bottom surface 7'. The magnetic tunnel junction 2 can be laterally embedded in a conventional insulating material 27 such as $SiO_2$ or TEOS.

As shown in FIG. 4, the strap portion 7 is in electrical contact with the bottom electrode through the metallic via 17, and the bottom thermal insulating layer 28 is therefore not placed in the electrical path of the magnetic tunnel junction 2. Since the bottom thermal insulating layer 28 is not connected in series with the tunnel barrier 22, it can be made of a material having an electric conductivity that is much lower than the one typically used for the thermal barriers 14, 15. For example, the bottom thermal insulating layer 28 can have an electrical conductivity that is below $10^{-14}$ S/cm. Preferably, the bottom thermal insulating layer 28 is made from a low-K material having a thermal conductivity below 1.0 W $m^{-1 \circ}$ $C.^{-1}$ and that can be integrated into the manufacturing process of the magnetic element 1. For example, the bottom thermal insulating layer 28 can be made of a material which offers low thermal conductivity such as porous $SiO_2$, SiN, or zirconia (yttria stabilized $ZrO_2$) having a thermal conductivity, at 20° C., of about 0.025 W $m^{-1 \circ}$ $C.^{-1}$. The low thermal conductivity material can also be a GST like material offering low thermal conductivity in its amorphous high resistive state. GST like material may consist of a chalcogenide compound material, such as GeSbTe, SbTe, GeTe or AgInSbTe.

In an preferred embodiment, the bottom thermal insulating layer 28 is made from a low-K material comprising fluorine or carbon doped silicon dioxide, hydrogenated silicon oxycarbide (SiCOH) having a thermal conductivity of approximately 0.21 W $m^{-1 \circ}$ $C.^{-1}$, porous SiCOH, porous methyl silsesquioxane (MSQ), porous hydrogen silsesquioxane (HSQ), spin-on organic polymeric dielectrics, or a combination of any of them. Here, the expression "low-k" preferably means any material having a dielectric constant less than approximately 3.9.

The bottom thermal insulating layer 28 having a lower thermal conductivity than the one the thermal barrier 14, 15, possibly up to about sixty times lower depending on the material used for the bottom thermal insulating layer 28, it allows for reducing heat dissipation in the magnetic tunnel junction 2 more effectively than in conventional magnetic elements using the thermal barrier 14, 15. Moreover, due to its placement, the bottom thermal insulating layer 28 can effectively block the heat dissipated from the metallic strap portion 7 that acts like a large heat dissipating area due to its high thermal conductivity and its relatively large size compared to the size of the magnetic tunnel junction 2. The bottom thermal insulating layer 28 can be easily integrated into the manufacturing process of the magnetic element 1, without increasing the complexity of the manufacturing process.

Figure 5:
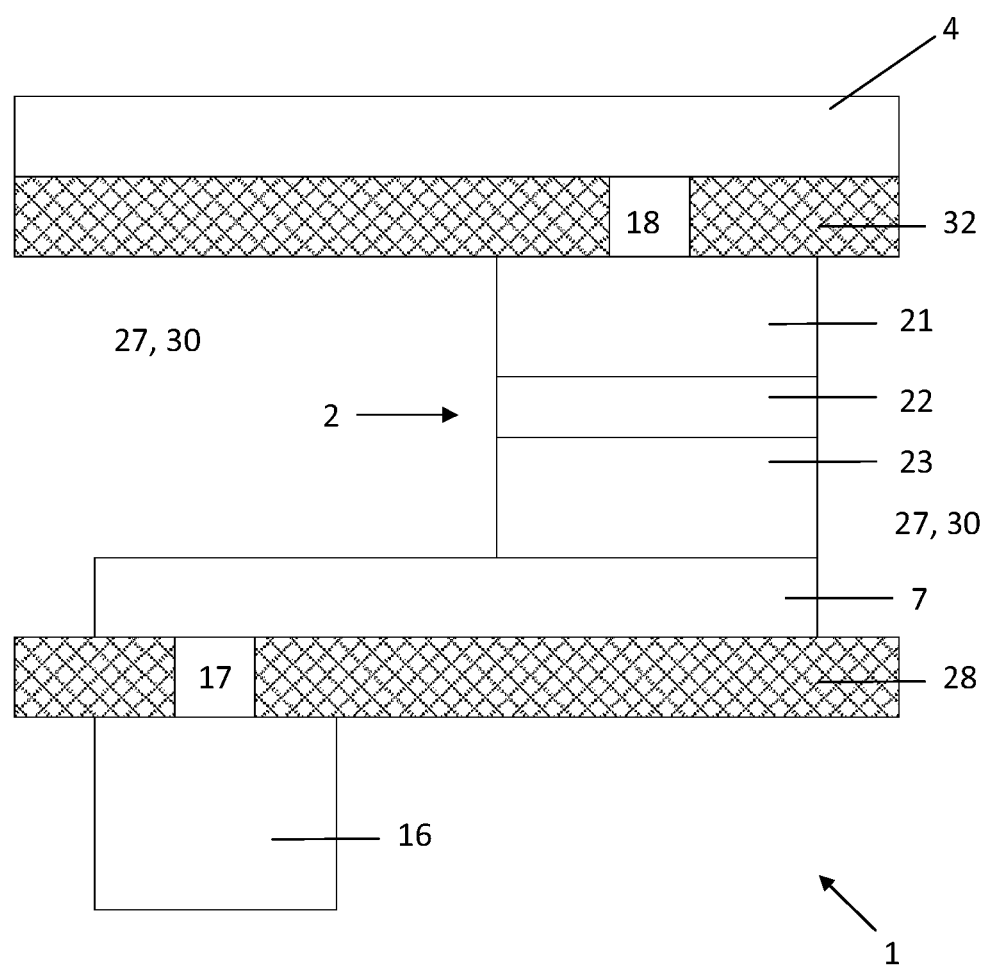
FIG. 5 shows the magnetic element according to another embodiment.

In another embodiment shown in FIG. 5, the magnetic element 1 further comprises an upper thermal insulating layer 32, arranged at the upper end of the magnetic tunnel junction 2, between the upper current line 4 and the magnetic tunnel junction 2, and extending substantially parallel to strap portion 7. In this configuration, an upper via 18 connects the upper current line 4 to the magnetic tunnel junction 2 and the upper thermal insulating layer 32 is not in the electrical path of the magnetic tunnel junction 2. The upper thermal insulating layer 32 further reduces heat dissipation from the magnetic tunnel junction 2. Alternatively, the magnetic element 1 can comprise the upper thermal insulating layer 32 alone, without the bottom thermal insulating layer 28. During the TAS write operation, the bottom thermal insulating layer 28, and possibly upper thermal insulating layer 32, will reduce dissipation of the heat produced by the heating current 31 in the magnetic tunnel junction 2.

In yet another embodiment not represented, the magnetic tunnel junction 2 further comprises the bottom and/or upper thermal barrier 14, 15 described above, at the bottom and upper end of the magnetic tunnel junction 2.

In yet another embodiment, the magnetic element 1 further comprises a lateral thermal insulating layer 30, laterally embedding at least a portion of the magnetic tunnel junction 2. This can be achieved, for example, by replacing the conventional insulating material 27 by a material having a thermal conductivity below 1.0 W $m^{-1 \circ}$ $C.^{-1}$. The lateral thermal insulating layer 30 can be made from the same material as the one used of the bottom and/or upper thermal insulating layer 28, 32, for example a low-K material. In fact, the lateral thermal insulating layer 30 can realized by the bottom and/or upper thermal insulating layer 28, 32 extending upwards and/or downwards, along the magnetic tunnel junction 2. Examples of FIGS. 4 and 5 show the magnetic element 1 where the conventional insulating material 27 has been replaced by the lateral thermal insulating layer 30, the latter embeds the whole magnetic tunnel junction 2.

In a variant of the embodiment, the portion of the magnetic tunnel junction 2 embedded by the lateral thermal insulating layer 30 can comprise the bottom magnetic layer 23, the upper magnetic layer 21, the tunnel barrier 22, the bottom and upper thermal barrier 14, 15 if present, or a combination of any of them. The rest of the magnetic tunnel junction 2 can be laterally embedded in the conventional insulating material 27, such as $SiO_2$ or TEOS.

In yet another embodiment not represented, the magnetic tunnel junction 2 is surrounded by a thin liner. The liner is typically made of a material having a etch rate that is lower than the one of the magnetic tunnel junction 2. In this configuration, the liner is a thin layer extending along the magnetic tunnel junction 2, and disposed between the magnetic tunnel junction 2 and the lateral thermal insulating barrier 30 and/or the conventional insulating material 27. The use of the liner can be advantageous during the fabrication process, especially when the magnetic tunnel junction 2 is etched in more than one step. For example, the liner can protect a first etched portion of the magnetic tunnel junction 2 when a second portion is being etched.

The lateral thermal insulating barrier 30 can further confine the heat produced by the heating current 31 between the sidewalls of the magnetic tunnel junction 2, resulting in further reducing heat dissipation. Moreover, since the electrical conductivity of the lateral thermal insulating layer 30 can be as low or lower that the electrical conductivity of the tunnel barrier 3, the lateral thermal insulating barrier 30 can reduce the electrical capacitance between the first, second layers 21, 23 and the tunnel barrier 22.

Figure 6:
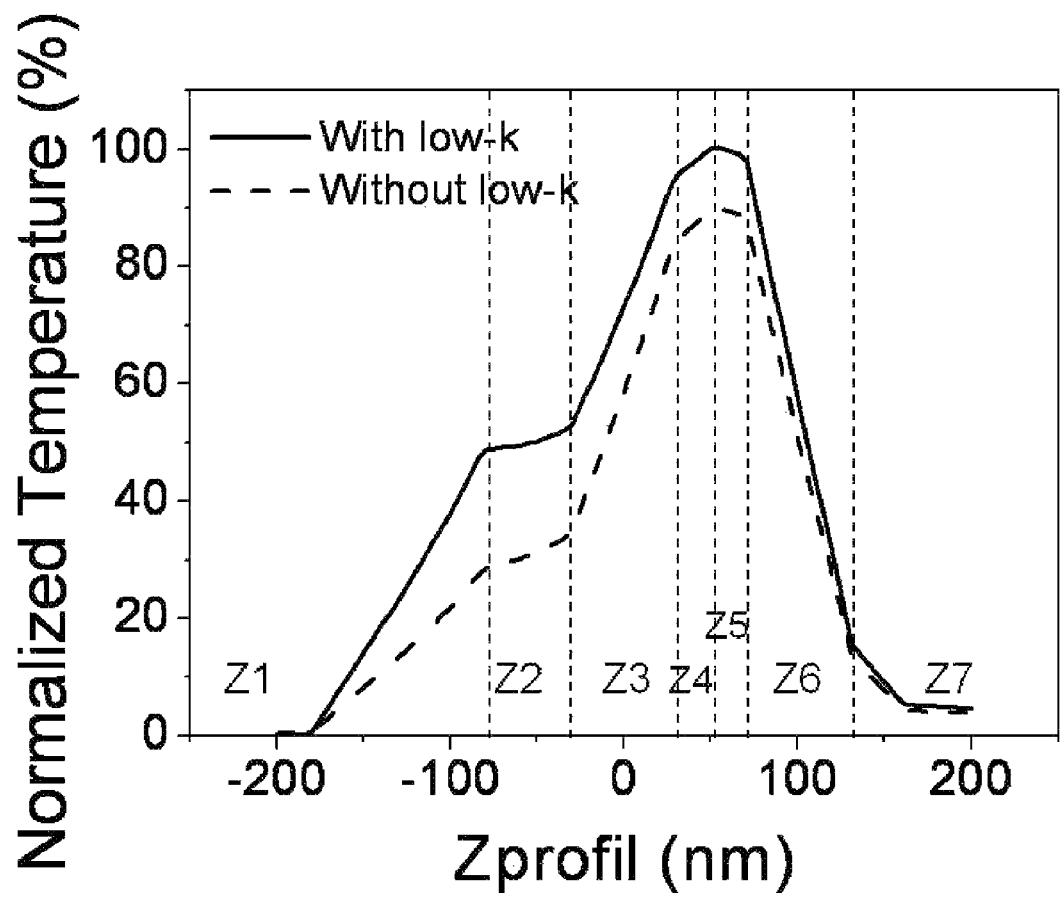
FIG. 6 represents simulated temperature distribution in the magnetic tunnel junction of the magnetic element according to an embodiment.
Figure 7:
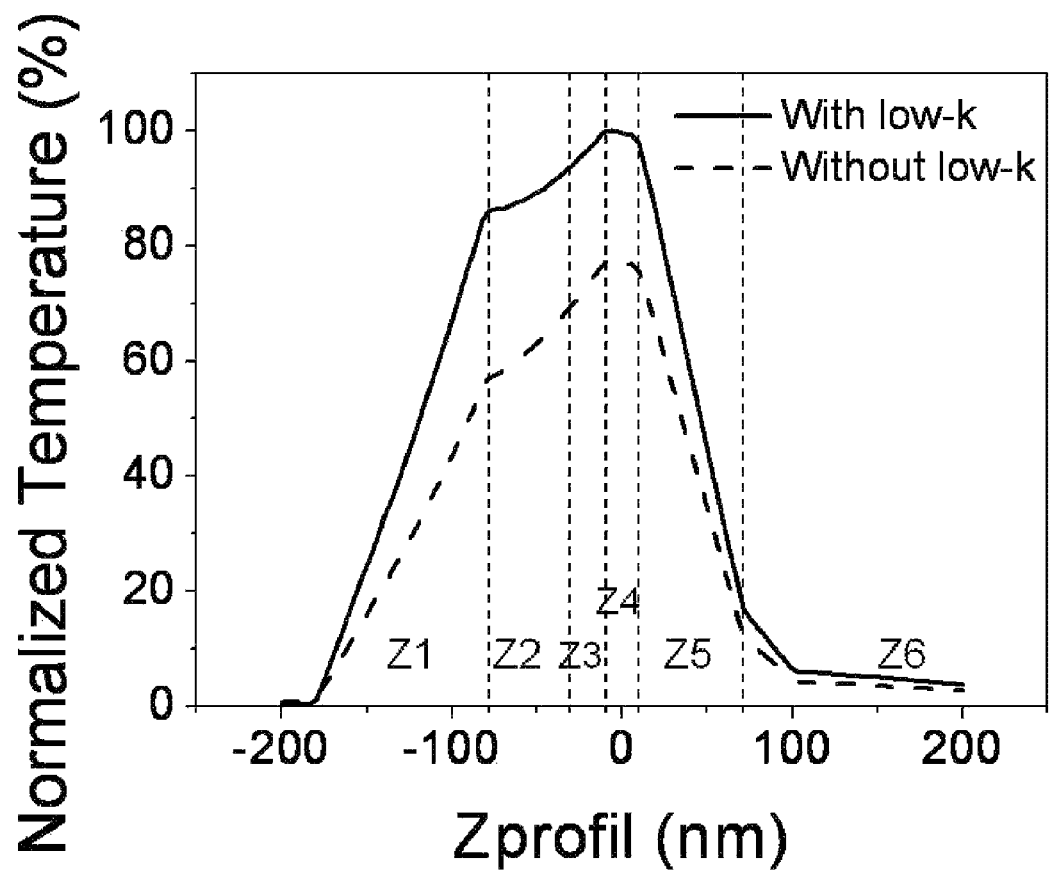
FIG. 7 represents simulated temperature distribution in the magnetic tunnel junction of the magnetic element according to another embodiment.

FIGS. 6 and 7 compare the temperature distribution simulated for the magnetic element 1 comprising the bottom thermal insulating barrier 28 (plain curves in FIGS. 6 and 7) and without it (dashed curves in FIGS. 6 and 7). Calculations were performed assuming the magnetic tunnel junction 2 having a diameter of 0.2 µm in which the heating current 31 is passed as a current pulse of 20 ns, the temperature distribution being shown at the end of the 20 ns current pulse. More particularly, in FIG. 6 the calculations were performed assuming the magnetic tunnel junction 2 comprising:

the strap portion 7 located in zone marked Z2;
the upper magnetic layer 23, located in zone Z4 and comprising a 5 nm thick ferromagnetic layer of CoFe and a 5 nm thick antiferromagnetic layer of IrMn;
the tunnel barrier 22 located at the interface Z4/Z5, made of MgO and having a thickness of 1 nm;
the upper magnetic layer 21, located in zone Z5 and comprising a 20 nm thick antiferromagnetic reference layer made of PtMn and a 5 nm thick ferromagnetic reference layer made of CoFe; and
the upper current line 4 located in zone Z7.

In FIG. 6, the magnetic tunnel junction 2 further comprises the bottom and upper thermal barrier 15, 14 having a thermal conductivity of 1.45 W m$^{-1}$° C.$^{-1}$, respectively located in zone Z3 and Z6. Temperature distribution simulated with the bottom thermal insulating barrier 28 located in zone Z1 (plain curve) shows temperatures within the magnetic tunnel junction 2 (zones Z4 and Z5) being about 10 to 20% higher compared to simulated temperatures without the bottom thermal insulating barrier 28 (dashed curve). Here the zones Z1 to Z7 correspond to a distance in nm along an axis A-A' shown in FIG. 4, with zone numbers increasing from A' to A. In the simulations, the thermal conductivity of the bottom thermal insulating barrier 28 was assumed to be 0.1 W m$^{-1}$° C.$^{-1}$.

In FIG. 7, simulations were performed without the bottom thermal barrier 15. In this figure, the magnetic tunnel junction 2 comprises the upper magnetic layer 23 located in zone Z3, the tunnel barrier 22 at the interface Z3/Z4, the upper magnetic layer 21 in zone Z4, the upper thermal barrier 14 in zone Z5, and the upper current line 4 located in zone Z6. Here, temperature distribution simulated with the bottom thermal insulating barrier 28 located in zone Z1 (plain curve) shows temperatures within the magnetic tunnel junction 2 (zones Z3 and Z4) being about 40% higher compared to simulated temperatures without the bottom thermal insulating barrier 28 (dashed curve). The thermal conductivity of bottom thermal insulating barrier 28 was also assumed to be 0.1 W m$^{-1}$° C.$^{-1}$. Simulated temperature distributions in FIG. 7 thus suggest that better heat confinement within the magnetic tunnel junction 2 can be obtained with the bottom thermal insulating barrier 28 than with the thermal barrier 14, 15. Since lower heat losses can be obtained with the bottom thermal insulating barrier 28, the magnetic element 1 can be written with a lower heating current 31, thus with lower power consumption.

A magnetic memory device (not represented) can comprise a plurality of the memory elements 1 arranged in rows and columns. Each memory element 1 can comprise the select transistor 3 electrically coupled to the magnetic tunnel junction 2. The magnetic memory device can further comprise one or a plurality of the upper current lines 4 that connect the magnetic elements 1 along a row, and one or a plurality of control current line coupled to the magnetic elements 1 along a column via the gate of their select transistor 3.

REFERENCE NUMBERS AND SYMBOLS 1 magnetic element
2 magnetic tunnel junction
21 upper magnetic layer, reference layer
22 tunnel barrier
23 bottom magnetic layer, storage layer
3 select transistor
31 heating current
4 upper current line
5 bottom current line
51 field current
52 magnetic field
7 strap portion
7' bottom surface of the strap portion
8 potential energy function
9 electron crossing the tunnel barrier by tunnel effect
10 phonons
11 magnons
14 upper thermal barrier
15 bottom thermal barrier
16 bottom electrode
17 bottom via
18 upper via
27 conventional insulating material
28 bottom thermal insulating layer
30 lateral thermal insulating layer
32 upper thermal insulating layer
40 simulated temperature distribution without thermal insulating layer
41 simulated temperature distribution with the lateral thermal insulating barrier
E potential energy
Efi Fermi inferior level
Efs Fermi superior level
eV potential difference between the two Fermi levels
$T_{BR}$, reference blocking temperature
$T_{BS}$ storage blocking temperature
$V_{heat}$ voltage for passing the heating current
X distance
X0 longitudinal coordinate
$\lambda_{in}$ inelastic mean free path

The invention claimed is:

1. A magnetic element to be written using a thermally-assisted switching write operation, comprising a magnetic tunnel junction formed from a tunnel barrier being disposed between first and second magnetic layers, said second magnetic layer having a second magnetization which direction can be adjusted during the write operation when the magnetic tunnel junction is heated at a high threshold temperature; an upper current line connected at the upper end of the magnetic tunnel junction; and a strap portion extending laterally and connected to the bottom end of the magnetic tunnel junction;
  the magnetic device further comprising a bottom thermal insulating layer extending substantially parallel to the strap portion and arranged such that the strap portion is between the magnetic tunnel junction and the bottom thermal insulating layer.

2. The magnetic element according to claim 1, further comprising an upper thermal insulating layer arranged at the upper end of the magnetic tunnel junction, between the upper current line and the magnetic tunnel junction.

3. The magnetic element according to claim 1, further comprising a lateral thermal insulating layer, laterally embedding at least a portion of the magnetic tunnel junction.

4. The magnetic element according to claim 3, said at least a portion of the magnetic tunnel junction comprises the bottom magnetic layer, the upper magnetic layer, the tunnel barrier, or a combination of any of them.

5. The magnetic element according to claim 3, said at least a portion of the magnetic tunnel junction comprises the whole magnetic tunnel junction.

6. The magnetic element according to claim 1, wherein the thermal insulating layer has a thermal conductivity lower than 1.0 Wm$^{-1}$° C.$^{-1}$.

7. The magnetic element according to claim 1, wherein the thermal insulating layer is made from a low-K material.

8. The magnetic element according to claim 1, wherein the magnetic tunnel junction further comprises an upper thermal barrier between the upper current line and the magnetic tunnel junction, and a bottom thermal barrier between the magnetic tunnel junction and the strap portion.

9. The magnetic element according to claim 8, wherein the longitudinal thermal barriers have an electrical resistance lower than the electrical resistance of the tunnel barrier by a factor of at least ten.

10. The magnetic element according to claim 1, further comprising an electrically insulating liner layer embedding the magnetic tunnel junction.

11. The magnetic element according to claim 1, further comprising a select transistor connected at the lower end of the magnetic tunnel junction via the strap portion and that can be activated to apply a heating current to said magnetic tunnel junction via the upper current line, for heating magnetic tunnel junction at the high threshold temperature.

12. A magnetic memory device comprising a plurality of magnetic elements, each magnetic element being adapted to be written using a thermally-assisted switching write operation and comprising: a magnetic tunnel junction formed from a first magnetic layer, a second magnetic layer having a second magnetization which direction can be adjusted during the write operation when the magnetic tunnel junction is heated at a high threshold temperature, and a tunnel barrier being disposed between a first magnetic layer; a strap portion extending laterally and connected to the bottom end of the magnetic tunnel junction; and a bottom thermal insulating layer extending substantially parallel to the strap portion and arranged such that the strap portion is between the magnetic tunnel junction and the bottom thermal insulating layer.

13. The magnetic memory device according to claim 12, further comprising one or a plurality of upper current lines, each current line being connected at the upper end of the magnetic tunnel junction.

14. The magnetic memory device according to claim 12, wherein each magnetic element further comprises a select transistor connected at the lower end of the magnetic tunnel junction via the strap portion, and wherein the magnetic memory device further comprises one or a plurality of control current lines, each control current line being coupled to the magnetic elements via their select transistor.

* * * * *